(12) United States Patent
Chen et al.

(10) Patent No.: US 6,906,364 B2
(45) Date of Patent: Jun. 14, 2005

(54) STRUCTURE OF A CMOS IMAGE SENSOR

(75) Inventors: Chong-Yao Chen, Chang-Hua (TW);
Chen-Bin Lin, Taipei (TW);
Feng-Ming Liu, Feng Shan (TW)

(73) Assignee: United Microelectronics Corp.,
Hsinchu (TW)

( * ) Notice: Subject to any disclaimer, the term of this patent is extended or adjusted under 35 U.S.C. 154(b) by 764 days.

(21) Appl. No.: 09/892,419

(22) Filed: Jun. 26, 2001

(65) Prior Publication Data

US 2002/0196480 A1 Dec. 26, 2002

(51) Int. Cl.⁷ ...................... H01L 31/062; H01L 31/113
(52) U.S. Cl. ................ 257/292; 257/291; 257/294
(58) Field of Search ............................. 257/290, 291, 257/292, 294

(56) References Cited

U.S. PATENT DOCUMENTS

| | | | | |
|---|---|---|---|---|
| 6,166,405 A | * | 12/2000 | Kuriyama et al. | 257/290 |
| 6,232,626 B1 | * | 5/2001 | Rhodes | 257/292 |
| 6,448,595 B1 | * | 9/2002 | Hsieh et al. | 257/292 |
| 2002/0089004 A1 | * | 7/2002 | Rhodes | 257/290 |
| 2004/0195600 A1 | * | 10/2004 | Rhodes | 257/292 |

* cited by examiner

Primary Examiner—Ngân Ngô

(57) ABSTRACT

A structure of a CMOS image sensory device is described. A photodiode sensory region and a transistor device region are isolated from each other by an isolation layer formed in the substrate. A gate structure is located on the transistor device region, and a source/drain region is in the transistor device region beside the side of the gate structure. A doped region is in the photodiode sensory region. A self-aligned block is located on the photodiode sensory region and a protective layer is formed on the entire substrate.

8 Claims, 4 Drawing Sheets

STRUCTURE OF A CMOS IMAGE SENSOR

BACKGROUND OF THE INVENTION

1. Field of Invention

This invention relates to a structure of a photodiode image sensor device. More particularly, the present invention relates to a structure of a CMOS image sensor (CIS).

2. Description of Related Art

A photodiode image sensor device is the most commonly used device for detecting images. A typical photodiode image sensor device comprises a reset transistor and a light sensor region formed by a photodiode. For example, a photodiode is formed with an N type doped region and a P type substrate. When the photodiode image sensor is in operation, a voltage is applied to the reset transistor gate to turn on the reset transistor and to charge the N/P diode junction capacitor. The reset transistor is turned off when the charging of the N/P diode junction capacitor has reached a certain high voltage. The N/P diode generates a reverse bias to form a depletion region. When a light is shinned on the N/P diode light sensor, electrons and holes are generated. These holes and electrons are separated by the electrical field of the depletion region, causing the electrons to travel in the direction of the N-type doped region to lower the voltage of the N-type doped region, whereas the holes travel in the direction of the P-type substrate.

A charge coupled device (CCD) has a high dynamic range and a low dark current. The sophistication of the current technology of a charge coupled device allows the charged couple device to become the most popular image sensing device. The manufacturing for a charge coupled device is, however, rather special. The price for a CCD is therefore very high. Moreover, the driver requires a high voltage operation, leading to the problems of high power dissipation and inability of random access of memory.

A CMOS image sensor has the characteristics of high quantum efficiency, low read noise, high dynamic range and random access, and it is one hundred percent compatible with the manufacturing for a CMOS device. A CMOS image sensor can combine with other control circuit, A/D converter and several signal processing circuits on a single wafer to achieve the so-called system on a chip (SOC). The progress of the technology of a CMOS image sensor, therefore, greatly reduces the cost of an image sensor device, the picture size and the power of dissipation. The CMOS image sensor is therefore slowly replacing the charge coupled device.

The structure of a conventional CMOS image sensor is summarized in the following.

Referring to FIG. 1A, a field oxide layer 102 is formed on a substrate 100. A reset transistor 120 that comprises a gate oxide layer 104 and a polysilicon gate 106 is formed on the substrate 100. The source/drain region 108 and the doped region 112 of the photodiode sensor region 110 are formed by implanting and thermal driving-in ions using the field oxide layer 102 and the polysilicon gate 106 as masks. A spacer 114 is formed on the sidewalls of the polysilicon gate 106 and the gate oxide layer 104. A self-aligned block (SAB) 116 is further formed on the photodiode sensor region 110 to complete the formation for a CMOS image sensor device.

The conventional CMOS image sensor, however, has the following problems.

After the above CMOS image sensor is formed, the backend process is conducted, such as the formation of the inter-layer dielectrics and metal conductive line, which are used for the controlling of the device. The application of plasma etching is inevitable in the backend process for, for example, the defining of the contact/via opening or the metal conductive line. The high power plasma, however, can penetrate the inter-layer dielectrics to induce damages on the surface of the photodiode. The damages inflicted upon the surface of the photodiode due to plasma etching are especially prominent in the vicinity of the bird's peak region. As a consequence, current leakage occurs more easily in the photodiode sensor region. The aforementioned current leakage problem would cause the CMOS image sensor to generate a significant dark current, leading to an increase of read noise.

SUMMARY OF THE INVENTION

The present invention provides a structure of a CMOS image sensor, wherein there is a protective layer formed on the CMOS image sensor before the backend process to prevent the CMOS image sensor from being damaged by plasma.

The present invention provides a structure of a CMOS image sensor, wherein the dark current problem of the CMOS image sensor is greatly mitigated.

The present invention provides a structure of a CMOS image sensor, which includes a photodiode sensor region, a transistor device region, a transistor, a self-aligned block and a protective layer. The photodiode sensor region and the transistor device region are formed in a substrate, and a self-aligned block is formed on the photodiode sensor region. A protective layer is formed on the entire substrate, covering the self-aligned block.

Accordingly, one aspect of the present invention is to provide a protective layer to cover the entire substrate after the manufacturing of the CMOS sensory device. The photodiode sensor region is thus protected from being damaged during the subsequent backend process to minimize the generation of dark current.

Moreover, besides protecting the photodiode sensory region, the protective layer formed on the entire substrate also protects other regions from being damaged by plasma etching.

Additionally, the protective layer and the self-aligned block comprise different refraction indices. As the incident light penetrates the surface of the photodiode sensor region, the incident light is refracted by the protective layer and the self-aligned block, which are of different refraction indices. The convertibility into photoelectrons of the light absorbed by the photodiode, after being refracted by the two layers of different refraction indices, is better. In another words, quantum efficiency is higher.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
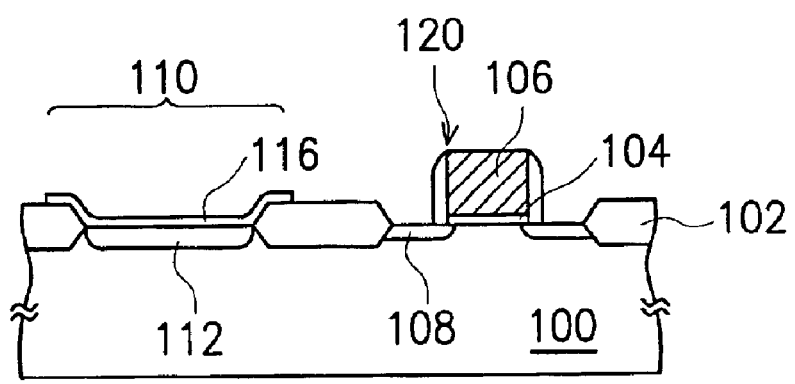
FIG. 1 is a schematic, cross-sectional view of the structure of a conventional CMOS image sensor.
Figure 2A:
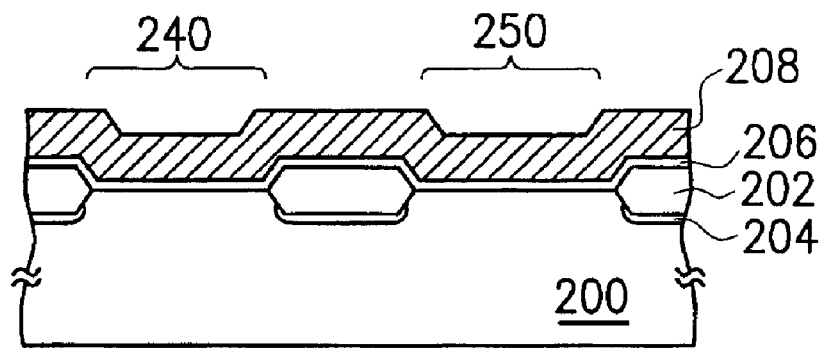
FIGS. 2A through 2E are schematic, cross-sectional views, illustrating the structure and the successive steps of fabricating a CMOS image sensor according to a preferred embodiment of the present invention.
Figure 2B:
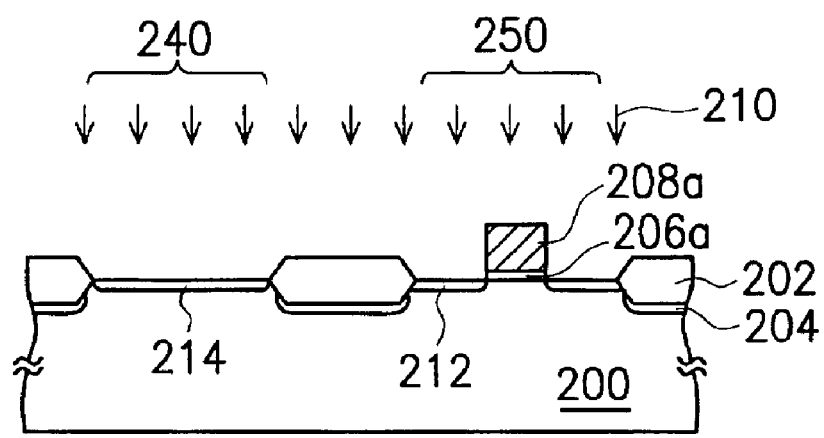
Figure 2C:
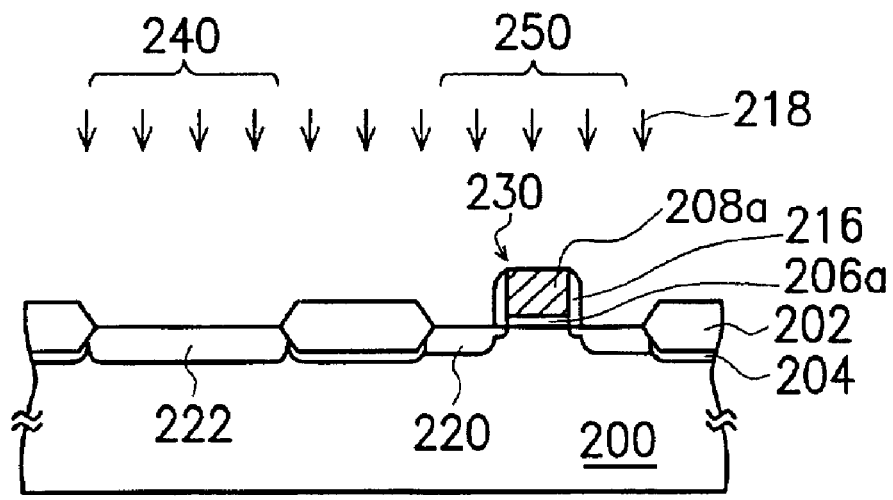
Figure 2D:
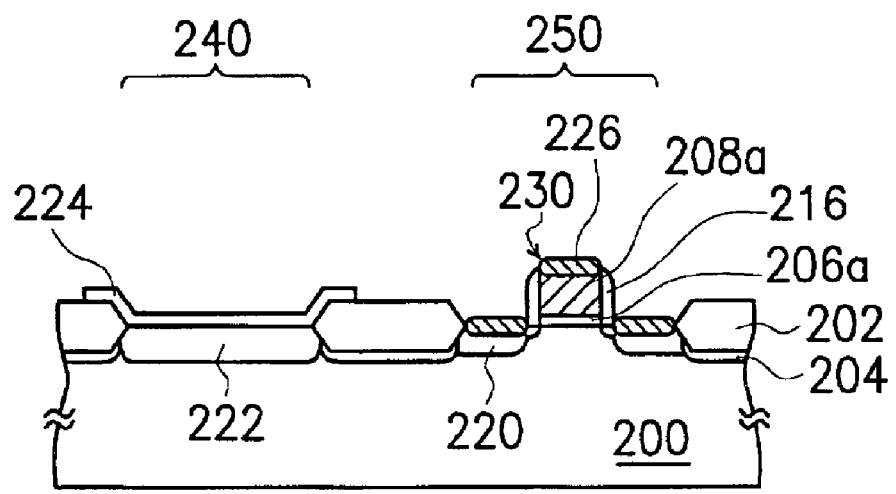
Figure 2E:
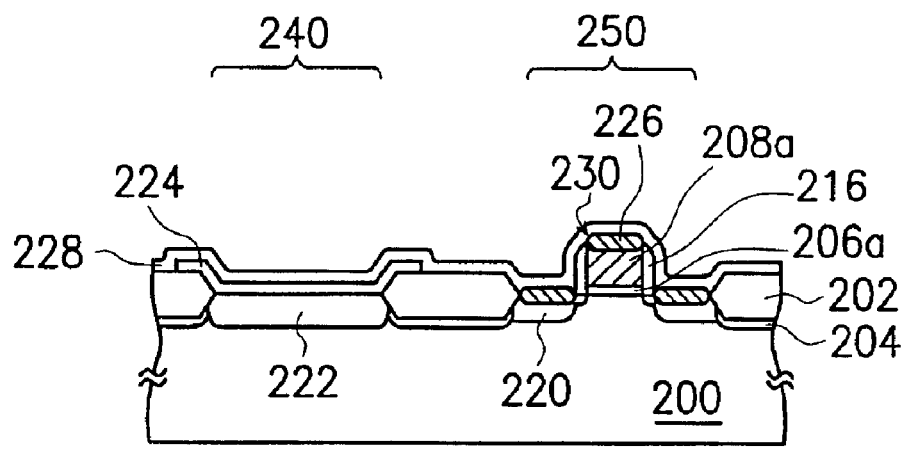

Referring to FIG. 2E, the CMOS image sensor of the present invention comprises a photodiode sensory region 240, a transistor device region 250, a transistor 230, a self-aligned block 224 and a protective layer 228.

The above photodiode sensory region 240 and the transistor device region 250 are formed on a substrate 200 and are isolated by an isolation layer 202. A channel isolation region 204 is further formed under the isolation layer 202.

The transistor 230 is, for example, a reset transistor or a transmission transistor, which includes a gate oxide layer 206a, a gate conductive layer 208a, a spacer 216 and a source/drain region 220. The gate oxide layer 206a and the gate conductive layer 208a are formed on the transistor device region 260. The spacer 216 is formed on the sidewalls of the gate oxide layer 206a and the gate conductive layer 208a, wherein the source/drain region 220 is formed in the transistor device region beside both sides of the spacer 216.

The gate oxide layer 204a is formed with, for example, silicon oxide by thermal oxidation. The gate conductive layer 206a is formed with, for example, polysilicon, polycide formed with polysilicon and metal or metal. The gate conductive layer 206a is formed by, for example, chemical vapor deposition or sputtering. When the gate conductive layer 208 is polysilicon, it is preferably to form a silicide layer 226 on the gate conductive layer 208a and the source/drain region 220 to lower the sheet resistance. The silicide layer 226 includes those formed with a refractory metal, such as titanium silicide or cobolt silicide, and is formed by a salicide process.

The photodiode sensory region 240 is formed with a heavily doped region 222 and the substrate 200. The dopant type for the heavily doped region 222 is same as that for the source/drain region 220. When the dopant for the substrate 200 is a p-type dopant, the dopant for the heavily doped region 222 is an n-type dopant. If the dopant for the substrate 200 is an n-type dopant, the dopant for the heavily doped region 222 is thereby a p-type dopant. According to the manufacturing process for a CMOS device, the photodiode sensory region 240 is also formed with a heavily doped region 222 and a doped well (not shown in Figure) formed between the heavily doped region 222 and the substrate 200. Therefore, the dopant type for the heavily doped region 222 includes the same type for the substrate 200.

The self-aligned block 224 is formed on the photodiode sensory region 240. The self-aligned block 224 includes silicon oxide formed by plasma enhanced chemical vapor deposition.

The protective layer 228 is formed on the entire substrate 200, covering the self-aligned block 224 and the transistor 230. The protective layer 228 includes silicon nitride, formed by, for example, plasma enhanced chemical vapor deposition.

FIGS. 2A to 2E illustrates the manufacturing of the above CMOS image sensor.

Referring to FIG. 2A, an isolation layer 202 is formed on the substrate 200 to define the photodiode sensory region 240 and the transistor device region 250, wherein a channel stop region 204 is formed under the isolation layer 202. The isolation layer 202, such as, a silicon oxide type of field oxide layer, is formed by, for example, local oxidation. An insulation layer 206 and a conductive layer 208 are sequentially formed on the substrate 200, wherein the insulation layer 206 is, for example, silicon oxide, formed by methods such as thermal oxidation. The conductive layer 208 is, for example, polysilicon, polycide formed with polysilicon and metal or metal, and is formed by methods such as chemical vapor deposition or magnetron DC sputtering.

Continuing to FIG. 2B, photolithography and etching are performed to define a conductive layer 208 and an insulation layer 206 to form a gate conductive layer 208a and gate oxide layer 206a of a transistor in the transistor device region 250. Thereafter, a light ion implantation 210 is conducted on the substrate 200 using the isolation layer 202 and the gate conductive layer 208a as masks. A lightly doped drain region 212 is formed in the substrate 200 on both side of the gate conductive layer 208a and the gate oxide layer 206a. A lightly doped region 214 is also formed in the photodiode sensory region 240. Depending on the dopant type of the substrate 200 is a p-type or an n-type, the dopant for the light ion implantation process 210 is an n-type phosphorus or arsenic, or a p-type boron.

Referring to FIG. 2C, a spacer 216 is formed on the sidewalls of the gate conductive layer 208a and the gate oxide layer 206a. The spacer 216, such as a silicon oxide layer, is formed by, for example, chemical vapor depositing a silicon oxide layer on the substrate 200, followed by anisotropic etching the silicon oxide layer to form a spacer 216. A heavy ion implantation 218 is further conducted to form a source/drain region 220 in the substrate beside the side of the spacer 214 and to form the heavily doped region 222 in the photodiode sensory region 240. The fabrication for a transistor 230 in the transistor device region 250 is thus completed. Depending on the dopant type of the substrate 200 is a p-type or an n-type, the dopant for the high ion implantation process 218 is an n-type phosphorus or arsenic, or a p-type boron.

Referring to FIG. 2D, a self-aligned block 224 is formed on the photodiode sensory region 240, wherein the self-aligned block 224 includes a silicon oxide layer and is formed by, for example, chemical vapor deposition. A silicon oxide layer (not shown in Figure) is formed on the substrate, followed by removing the silicon oxide layer in the salicide region, for example, in the transistor device region 250. The silicide layer 226 is formed on the gate conductive layer 208a and the source/drain region 220 in the transistor device region 250.

As shown in FIG. 2E, a protective layer 228 is formed on the substrate, wherein the protective layer 228 covers the regions include the photodiode sensory region 240, the transistor device region 250 and peripheral circuit region (not shown in Figure). The protective layer 228, such as silicon nitride, is formed by, for example, plasma enhanced chemical vapor deposition using silane and ammonium as processing gas.

After the formation of the CMOS image sensor, a protective layer 228 is formed to cover the entire substrate 200 to prevent damages being induced upon the photodiode by plasma etching in the subsequent backend processing.

Moreover, this protective layer 228 is formed on the entire substrate 200. In addition to provide a protection for the photodiode sensory region 240, other regions are also protected from being damaged by plasma etching.

Figure 3:
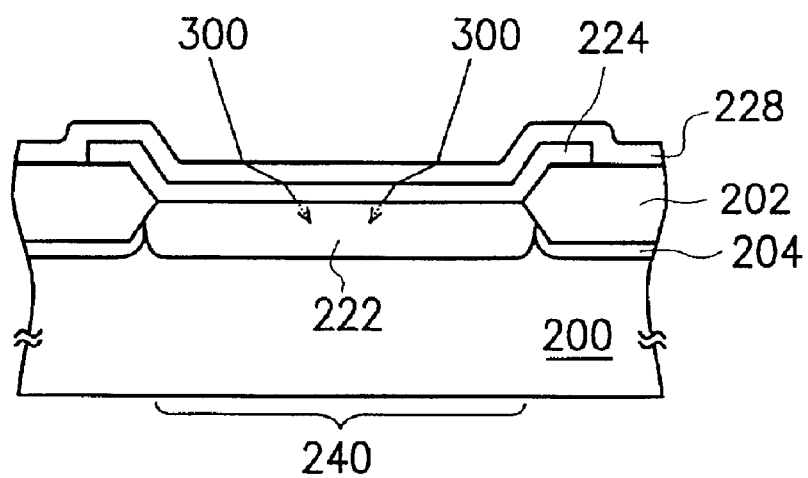
FIG. 3 is a schematic diagrams illustrating incident lights entering a CMOS image sensor according to a preferred embodiment of the present invention.

Referring to FIG. 3, FIG. 3 is a schematic diagram illustrating a part of the photodiode shown in FIG. 2E. The protective layer 228 is silicon nitride and the self-aligned block 224 is silicon oxide and the two layers comprise different refraction indices. As the incident light 300 penetrates the surface of the photodiode sensory region, the incident light 300 is refracted by the protective layer and the self-aligned block, which are of two different refraction indices. The convertibility into photoelectrons of the light absorbed by the photodiode and, after being refracted by the two layers of different refraction indices is better. In other words, quantum efficiency is higher.

Based on the foregoing, the present invention provides a formation of a protective layer to cover the CMOS photodiode image sensor. The photodiode sensory region is thus protected by the protective layer and is prevented from being damaged by plasma etching in the backend process. The generation of dark current is thus reduced to the minimum.

Moreover, the protective layer is formed on the entire substrate. Therefore, other regions are also protected from being damaged by plasma etching in addition to the photodiode sensory region.

The protective layer and the self-aligned block comprise different refraction indices. As the incident light penetrates the surface of the photodiode sensory region, the incident light is refracted by the protective layer and the self-aligned block, which are of different refraction indices. The convertibility into photoelectrons of the light absorbed by the photodiode, after being refracted by the two layers of different refraction indices, is better. In another words, quantum efficiency is higher.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A CMOS image sensor, comprising;

a substrate;

a photodiode sensory region located in the substrate;

a transistor device region located in the substrate, wherein the photodiode sensory region is isolated from the transistor device region by an isolation layer;

a transistor located on the transistor device region, wherein the transistor comprises a gate oxide layer, a gate conductive layer, a spacer and a source/drain region;

a self-aligned block, located on the photodiode sensory region; and a protective layer located on the substrate, covering the self-aligned block and the entire transistor device region.

2. The CMOS image sensor of claim 1, wherein the protective layer includes a material that prevents erosion from plasma etching.

3. The CMOS image sensor of claim 1, wherein the protective layer includes silicon nitride.

4. The CMOS image sensor of claim 1, wherein the self-aligned block includes silicon oxide.

5. The CMOS image sensor of claim 1, wherein the self-aligned sensory region includes a doped region and a dopant type for the doped region is same as that for the source/drain region.

6. The CMOS image sensor of claim 1, wherein the CMOS image sensor further includes a suicide layer to cover the gate conductive layer and the source/drain region.

7. The CMOS image sensor of claim 1, wherein the substrate comprises a p-type dopant and the photodiode sensory region comprises an n-type doped region.

8. The CMOS image sensor of claim 1, wherein the substrate comprises an n-type dopant and the photodiode sensory region comprises a p-type doped region.

* * * * *